United States Patent
Lin

(10) Patent No.: US 9,005,761 B2
(45) Date of Patent: Apr. 14, 2015

(54) HALOGEN-FREE RESIN COMPOSITION AND ITS APPLICATION FOR COPPER CLAD LAMINATE AND PRINTED CIRCUIT BOARD

(75) Inventor: Yu-Te Lin, Tao-Yuan Hsien (TW)

(73) Assignee: Elite Material Co., Ltd., Tao-Yuan Hsien (TW)

( * ) Notice: Subject to any disclaimer, the term of this patent is extended or adjusted under 35 U.S.C. 154(b) by 179 days.

(21) Appl. No.: 13/335,658

(22) Filed: Dec. 22, 2011

(65) Prior Publication Data

US 2013/0161080 A1 Jun. 27, 2013

(51) Int. Cl.
| | |
|---|---|
| H05K 1/03 | (2006.01) |
| B32B 15/092 | (2006.01) |
| B32B 27/04 | (2006.01) |
| B32B 27/18 | (2006.01) |
| B32B 27/38 | (2006.01) |
| C08L 63/00 | (2006.01) |
| C08G 59/20 | (2006.01) |
| C08G 59/50 | (2006.01) |
| C08G 59/56 | (2006.01) |
| B32B 27/20 | (2006.01) |
| C08G 59/42 | (2006.01) |
| C08L 35/06 | (2006.01) |
| C08L 79/04 | (2006.01) |
| C08G 73/02 | (2006.01) |
| C08L 79/02 | (2006.01) |
| C08K 5/00 | (2006.01) |
| C08K 5/49 | (2006.01) |

(52) U.S. Cl.
CPC .............. *C08G 59/56* (2013.01); *B32B 15/092* (2013.01); *B32B 27/04* (2013.01); *B32B 27/20* (2013.01); *B32B 27/38* (2013.01); *H05K 1/0366* (2013.01); *C08L 35/06* (2013.01); *C08L 79/04* (2013.01); *C08G 73/0233* (2013.01); *C08L 79/02* (2013.01); *C08G 59/4284* (2013.01); *C08L 63/00* (2013.01); *H05K 1/0346* (2013.01); *H05K 1/0373* (2013.01); *H05K 2201/012* (2013.01); *H05K 2201/0209* (2013.01); *C08K 5/0025* (2013.01); *C08K 5/49* (2013.01); *Y10S 428/901* (2013.01)

(58) Field of Classification Search
CPC ...... B32B 15/092; B32B 27/04; B32B 27/18; B32B 27/20; B32B 27/26; B32B 27/38; H05K 1/0353; H05K 1/0366; H05K 1/0373; C08G 59/18; C08G 59/20; C08G 59/40; C08G 59/50; C08G 59/5033; C08G 59/504; C08L 63/00
USPC .............. 252/601, 609; 428/297.4, 413, 414, 428/416, 418, 901; 523/451, 452, 457, 458, 523/461, 466; 525/523, 529, 530, 533
See application file for complete search history.

(56) References Cited

U.S. PATENT DOCUMENTS

| | | | |
|---|---|---|---|
| 7,255,925 B2 | 8/2007 | Chung | |
| 2002/0006515 A1* | 1/2002 | Luttrull | 428/416 |
| 2011/0053447 A1* | 3/2011 | Su et al. | 442/147 |
| 2011/0278052 A1* | 11/2011 | Hsu | 174/258 |

FOREIGN PATENT DOCUMENTS

JP 2003266596 A * 9/2003 .............. B32B 15/08

OTHER PUBLICATIONS

Machine translation of JP 2003266596 A, provided by the JPO website (no date).*
Registry Data for 80-08-0, provided by STN (no date).*

* cited by examiner

*Primary Examiner* — Michael J Feely
(74) *Attorney, Agent, or Firm* — Muncy, Geissler, Olds & Lowe, P.C.

(57) ABSTRACT

A halogen-free resin composition includes (A) 100 parts by weight of epoxy resin; (B) 1 to 100 parts by weight of benzoxazine resin per 100 parts by weight of (A); (C) 1 to 100 parts by weight of styrene-maleic anhydride per 100 parts by weight of (A); (D) 0.5 to 30 parts by weight of amine curing agent per 100 parts by weight of (A); and (E) 5 to 150 parts by weight of halogen-free flame retardant per 100 parts by weight of (A). The composition obtains properties of low dielectric constant, low dissipation factor, high heat resistance and flame retardancy by specific composition and ratio. Thus, a prepreg or a resin film, which can be applied to a copper clad laminate and a printed circuit board, is formed.

10 Claims, No Drawings

HALOGEN-FREE RESIN COMPOSITION AND ITS APPLICATION FOR COPPER CLAD LAMINATE AND PRINTED CIRCUIT BOARD

FIELD OF THE INVENTION

This invention is related to halogen-free resin compositions, and more particular, to a halogen-free resin composition which can be applied to a copper clad laminate and a printed circuit board.

BACKGROUND OF THE INVENTION

In accordance with the worldwide trend of environmental protection and green regulations, adoption of halogen-free standards is the current environmental trend for the global electronics industry. Countries in the world and the electronic related factory established a mass production schedule for halogen-free electronic products. After the Restriction of Hazardous Substances (RoHS) came into force, substances, such as lead, cadmium, mercury, hexa-valent chromium, polybrominated biphenyl, and polybrominated diphenyl ether, are forbidden from being used in manufacturing electronic products or the spare parts thereof. Printed circuit boards (PCB) form the foundation of electronic products and machinery products. Thus, the first and foremost category of objects scrutinized under the halogen-free policy is printed circuit boards. International organizations put forth strict requirements for the halogen content of printed circuit boards. The International Electrotechnical Commission (IEC) rule 61249-2-21 ruled that, in printed circuit boards, the content of the bromide or chloride need to be lower than 900 ppm and the content of total halogen need to be lower than 1500 ppm. The Japan Electronics Packaging Circuits Association (JPCA) ruled that the content of both bromide and chloride need to be lower than 900 ppm. At this stage, the Greenpeace Organization promotes the green policies to ask all related manufacturers to eliminate polyvinylchloride and brominated flame retardants from their electronic products in order to offer lead-free and halogen-free electronic products. Therefore, manufacturers nowadays are interested in halogen-free materials.

There is a trend of new generation electronic products toward thin and lightweight electronic products and high frequency transmission. Thus, the layout of the printed circuit boards trends toward high density. The material selection for the PCB trends toward increasingly strict selection criteria. For bonding the high-frequency electronic device and the PCB, the base material of the PCB must satisfy both the lower dielectric constant (DK) and the dielectric loss (also called dissipation factor, Df) to maintain the transmission speed and the completeness of the transmission signal. At the same time, to maintain the normal operation function of the electronic device at high temperature and high humidity condition, the PCB must satisfy properties of heat resistance, flame retardancy and low water absorption. Epoxy resin has been widely used for copper clad laminate or the sealing material of the electronic spare parts or the electric machinery due to its excellent properties of being adhesive, heat resistant and formable. From the viewpoint of fire prevention, normally, the flame retardant effect of the flame retardant material is obtained by combining the non-flame retardant epoxy resin and the flame retardant. For example, the flame retardancy can be obtained by introducing halogen into the epoxy resin, especially bromine, to improve the reactivity of the epoxy group.

However, recently, the electronic products trend toward lightweight, small and circuit miniaturization. Under such requirements, using the halide, which has high specific gravity, is not a good ideal form the lightweight point of view. Additionally, after operating at high temperature for a long period, the halide might be dissociated and can corrode the fine wiring. Moreover, after combustion, the scrapped electronic parts will produce harmful compounds, such as halide, which is unfriendly to the environment. To replace the halide flame retardant above-mentioned, a means of using the phosphorus compound as the flame retardant has been developed, such as adding phosphate or red phosphorus into the epoxy resin composition. However, the phosphate will dissociate the acid because of the hydrolysis reaction, and transference resistance will be compromised. The Fire Services Act states that, while it is a good flame retardant, red phosphorus is a dangerous substance, because it produces a small amount of phosphine gas at high temperature and moist environment.

The printed circuit boards manufactured from the conventional copper clad laminate use an epoxy resin and a curing agent as the thermosetting resin composition material. The reinforcing material (such as glass fabric) and the thermosetting resin composition are heating and combining to form a prepreg. Then, the prepreg, the upper and lower foils are laminated at high temperature and high pressure. Generally, in the prior art technology, an epoxy resin and a curing agent, which is the phenol novolac resin having the hydroxyl (—OH) group, are the material of the thermosetting resin composition. After reacting the phenol novolac resin and the epoxy resin, the epoxy group will ring open to form another hydroxyl group. The hydroxyl group itself will increase the dielectric constant and the dissipation factor and is easy to combine with moisture increasing the water absorption.

U.S. Pat. No. 7,255,925 disclosed a thermosetting resin composition using the cyanate ester resin, dicyclopentadiene epoxy resin, silica and thermoplastic resin. This thermosetting resin composition has properties of low dielectric constant and low dissipation factor. However, a halogen-containing (such as bromine) flame retardant needs to be used in this manufacturing process, such as tetra-bromo cyclohexane, hexa-bromo cyclodecane and 2,4,6-Tri(tribromo-phenoxy)-1,3,5-triazine. The bromine-containing flame retardant causes the environment pollution during manufacturing, using or even recycling and abandonment. To improve the heat resistance, flame retardancy, low dissipation factor, low water absorption, high cross-linking density, high glass transition temperature, high connectivity and appropriate thermal expansion of the copper clad laminate, the epoxy resin, curing agent and reinforcing material become the main factors for the material selection.

As for the electrical property, the main consideration is the dielectric constant and the dissipation factor of the material. Generally, since the signal transmission speed of the laminate is inversely proportional to the square root of the dielectric constant of the laminate material, the dielectric constant is as small as possible. On the other hand, the smaller dissipation factor indicates the smaller signal transmission loss. Thus, the material having the smaller dissipation factor provides the better signal transmission quality.

Therefore, a material with low dielectric constant and low dissipation factor for manufacturing the high frequency printed circuit board is the problem that the PCB material suppliers want to solve at this stage.

SUMMARY OF THE INVENTION

In view of the disadvantages of the prior technology, the applicant realized that it is not perfect and try his best to overcome the disadvantages above-mentioned. Relying on the experiment in this technology field, the applicant developed a halogen-free resin composition to achieve the purposes of low dielectric constant, high heat resistance and high frame retardancy.

The main purpose of this invention is to provide a halogen-free resin composition, comprising the specific composition and ratio to achieve the purposes of low dielectric constant, low dissipation factor, high heat resistance and high frame retardancy. A prepreg or resin film, which can be applied to the copper clad laminate and printed circuit board, is formed.

To achieve the purposes above-mentioned, this invention provides a halogen-free composition comprising (A) 100 parts by weight of epoxy resin; (B) 1 to 100 parts by weight of benzoxazine resin per 100 parts by weight of (A); (C) 1 to 100 parts by weight of styrene-maleic anhydride (SMA) per 100 parts by weight of (A); (D) 0.5 to 30 parts by weight of amine curing agent per 100 parts by weight of (A); and (E) 5 to 150 parts by weight of halogen-free flame retardant per 100 parts by weight of (A).

The composition above-mentioned is used for manufacturing the prepreg, resin film, copper clad laminate and printed circuit board. Thus, the halogen-free resin composition disclosed in this invention achieves the purposes of low dielectric constant, low dissipation factor, high heat resistance and high frame retardancy by specific composition and ratio. A prepreg or resin film, which can be applied to the copper clad laminate and printed circuit board, is formed.

The composition (A), epoxy resin, of the halogen-free resin composition disclosed in this invention is one of the following: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, phosphorous-containing epoxy resin, DOPO containing epoxy resin, DOPO-HQ containing epoxy resin, p-xylene epoxy resin, naphthalene epoxy resin, benzopyran epoxy resin, biphenyl novolac epoxy resin, isocyanate modified epoxy resin, phenol benzaldehyde epoxy resin and phenol aralkyl novolac epoxy resin or the combination thereof.

The composition (B), benzoxazine resin, of the halogen-free resin composition disclosed in this invention comprises bisphenol A type benzoxazine resin, bisphenol F type benzoxazine resin and phenolphthalein type benzoxazine resin. More particularly, it is preferably selected from the group consisting at least one of:

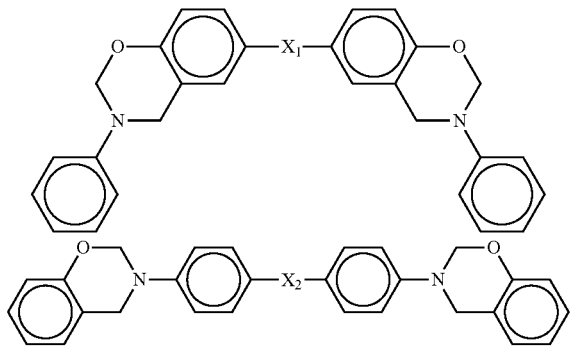

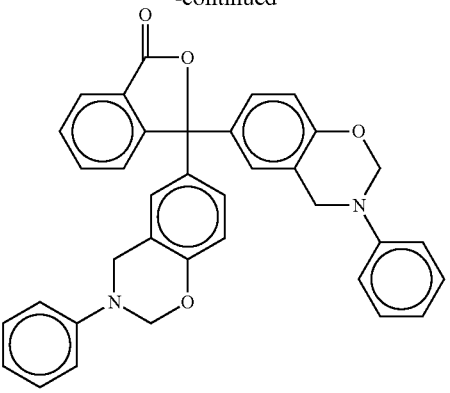

wherein $X_1$ and $X_2$ are independently R or Ar or —$SO_2$—; R is selected from —$C(CH_3)_2$—, —$CH(CH_3)$—, —$CH_2$— and substituted or un-substituted dicyclopentadieny group; Ar is the functional group selected from substituted or un-substituted benzene, biphenyl, naphthalene, novolac, bisphenol A, bisphenol A novolac, bisphenol F and bisphenol F novolac functional group.

The base of the halogen-free resin composition of this invention is 100 parts by weight of epoxy resin; and then 1 to 100 parts by weight of benzoxazine resin is added. The desired low dissipation factor (Df) can be obtained if the content of the benzoxazine resin is within this range. The requirement of the desired low dissipation factor cannot be met if the benzoxazine resin is less than 1 parts by weight. However, the heat resistance of the laminate made by the resin composition will become worse if the benzoxazine resin is more than 100 parts by weight. More particularly, in the halogen-free resin composition disclosed in this invention, the preferably content of the benzoxazine resin is 15 to 70 parts by weight.

In the composition (C), styrene-maleic anhydride, of the halogen-free resin composition disclosed in this invention, the ratio of the styrene and maleic anhydride can be 1/1, 2/1, 3/1, 4/1, 6/1 or 8/1 such as styrene-maleic anhydride copolymer of trade name SMA-1000, SMA-2000, SMA-3000, EF-30, EF-40, EF-60 and EF-80. Additionally, the described styrene-maleic anhydride also can be an styrene-maleic anhydride ester, such as trade name SMA 1440, SMA 17352, SMA 2625, SMA 3840 and SMA 31890.

The base of the halogen-free resin composition of this invention is 100 parts by weight of epoxy resin; and then 1 to 100 parts by weight of styrene-maleic anhydride is added. The desired low dielectric constant (Dk) can be obtained if the content of styrene-maleic anhydride is within this range. The requirement of the desired low dielectric constant cannot be met if the styrene-maleic anhydride is less than 1 parts by weight. However, if the content of styrene-maleic anhydride is more than 100 parts by weight, the resulting prepreg will have flawed appearance and tend to have surface pitting, thereby lower yield. More particularly, in the halogen-free resin composition disclosed in this invention, the preferably content of the styrene-maleic anhydride is 10 to 50 parts by weight.

In the composition (D), the amine curing agent, of the halogen-free resin composition disclosed in this invention is the resin having the amino functional group, preferable is the resin having diamino functional group. More particularly, the amine curing agent can be one of diamino diphenyl sulfone, diamino diphenyl methane, diamino diphenyl ether, diamino diphenyl sulfide, dicyandiamide (DICY) or the combination thereof. The described amine curing agent is preferably one of 4,4'-diamino diphenyl sulfone, 4,4'-diamino diphenyl methane, 4,4'-diamino diphenyl ether, 4,4'-diamino diphenyl sulfide, dicyandiamide (DICY) or the combination thereof.

The base of the halogen-free resin composition of this invention is 100 parts by weight of epoxy resin; and then 0.5 to 30 parts by weight of amine curing agent is added. The strength between the copper foil and the halogen-free resin composition can be improved if the content of the amine curing agent is within this range. The desired strength cannot be obtained if the amine curing agent is less than 0.5 parts by weight. However, in the laminate made by resin composition, the heat resistance decreases and the water absorption increases and thus the physical properties will be decreased if the amine curing agent is more than 30 parts by weight. More particularly, in the halogen-free resin composition of the invention, the preferably content of the amine curing agent is 2 to 15 parts by weight.

In the composition (E), the halogen-free flame retardant, of the halogen-free resin composition disclosed in this invention is nitrogen-containing flame retardant or phosphorous-containing flame retardant. The described halogen-free flame retardant is selectively adding but not limit to at least one of the following compound: bisphenol diphenyl phosphate, ammonium poly phosphate, hydroquinone bis-(diphenyl phosphate), bisphenol A bis-(diphenylphosphate), tri(2-carboxyethyl)phosphine (TCEP), tri(isopropyl chloride) phosphate, trimethyl phosphate (TMP), dimethyl methyl phosphonate (DMMP), resorcinol dixylenylphosphate (RDXP, such as PX-200), phosphazene, (such as SPB-100), melamine polyphosphate, melamine cyanurate, tri-hydroxy ethyl isocyanurate, but not limit. Additionally, the halogen-free flame retardant also can be 9,10-dihydro-9-oxa-10-phosphaphenanthrene-10-oxide (DOPO), DOPO-containing phenol resin (such as DOPO-HQ, DOPO-PN, DOPO-BPN), DOPO-containing epoxy resin and DOPO-HQ-containing epoxy resin, etc, wherein the DOPO-BPN can be DOPO-BPAN, DOPO-BPFN, DOPO-BPSN bisphenol novolac compound.

The base of the halogen-free resin composition of this invention is 100 parts by weight of epoxy resin; and then 10 to 150 parts by weight of halogen-free flame retardant is added. The flame retardation can be achieved by the halogen-free resin composition if the content of halogen-free flame retardant is within this range. The flame retardation cannot be obtained if the halogen-free flame retardant is less than 10 parts by weight. However, the water absorption will be increased and the heat resistance of the laminate will become worse if the content of the flame retardant is more than 150 parts by weight.

The halogen-free resin composition of this invention further comprises one of the inorganic filler, curing accelerator, silane coupling agent, toughening agent, solvent or the combination thereof.

The purpose of adding the inorganic filler to the halogen-free resin composition of this invention is to improve the thermal conductivity, modify the thermal expansion and mechanical strength, etc. Moreover, the inorganic filler is preferably uniformly distributed in the resin composition. The inorganic filler can be silica (fused, non-fused, porous or hollow silica), aluminium oxide, aluminium hydroxide, magnesium oxide, magnesium hydroxide, calcium carbonate, aluminium nitride, boron nitride, aluminium silicon carbide, silicon carbide, titanium dioxide, zinc oxide, zirconium oxide, mica, boehmite (AlOOH), calcined talcum powder, talcum powder, silicon nitride and calcined kaolinite. Moreover, the inorganic filler can be spherical, fibrous, tabular, granular, flake or beard-like and optional pre-treating by the silane coupling agent.

The inorganic filler is particle powder with particle size smaller than 100 μm, preferable between 1 nm to 20 μm, more preferably is the nano-diameter powder with size smaller than 1 μm. The diameter of the beard-like inorganic filler is smaller than 50 μm and its length is between 1 to 200 μm.

The base of the halogen-free resin composition of this invention is 100 parts by weight of epoxy resin; and then 10 to 1000 parts by weight of inorganic filler is added. No significantly thermal conductivity and improved thermal expansion and mechanical strength if the content of the inorganic filler is less than 10 parts by weight. However, filling mobility of the resin composition and its adhesive with copper foil become worse if the content of the inorganic filler is more than 1000 parts by weight.

The curing accelerator described in this invention comprises catalyst, such as Lewis base or Lewis acid. The Lewis base includes one of imidazole, trifluoro-borane amine complex, ethyltriphenyl phosphonium chloride, 2-methylimidazole (2MI), 2-phenyl-1H-imidazole (2PZ), 2-ethyl-4-methyl imidazole (2E4MI), triphenylphosphine (TPP) and 4-dimethylaminopyridine (DMAP) or the combination thereof. The Lewis acid includes metal salt, such as manganese, iron, cobalt, nickel, copper and zinc, and metal catalyst, such as zinc octanoate and cobalt octanoate.

The silane coupling agent described in this invention includes silane and siloxane. According to the type of the functional group, the coupling agent can be divided into amino silane, amino siloxane, epoxy silane and epoxy siloxane.

The toughening agent described in this invention is selected from the rubber resin, carboxyl-terminated butadiene acrylonitrile rubber (CTBN), core-shell rubber, etc.

The solvent described in this invention is selected from methanol, ethanol, 2-methoxyethanol, acetone, butanone (methyl ethyl ketone), methyl isobutyl ketone, cyclohexanone, toluene, dimethylbenzene, methoxyethyl acetate, ethoxyethyl acetate, propoxyethyl acetate, ethyl acetate, dimethylformamide, methoxy-2-propanol and the mixture thereof.

The halogen-free resin composition of this invention further comprises one of the following resin or the combination thereof: phenol resin, phenol novolac resin, polyphenylene ether resin, cyanate ester resin, isocyanate ester resin, maleimide resin, polyester resin, styrene resin, butadiene resin, phenoxy resin, polyamide resin, polyimide resin.

Another purpose of this invention is to disclose a prepreg having properties of low dielectric constant, low dissipation factor, heat resistance, flame retardancy, low water absorption, and being halogen-free. Accordingly, the prepreg disclosed in this invention comprises a reinforcing material and the halogen-free resin composition above-mentioned, wherein the halogen-free resin composition is impregnated to the reinforcing material and semi-cured by heating at high temperature. The reinforcing material can be a fiber material, woven fabric and nonwoven fabric, such as glass fabric, etc, which can improve the mechanical strength of the prepreg. Additionally, the reinforcing material can be selectively pre-treated by silane coupling agent or siloxane coupling agent, such as glass fabric pre-treated by silane coupling agent.

The prepreg above-mentioned is cured at high temperature or at both high temperature and high pressure to form a cured film or a solid state insulator. The solvent can be evaporated and removed at high temperature if there is solvent comprised in the halogen-free resin composition.

Yet another purpose of this invention is to disclose a copper clad laminate having properties of low dielectric constant, heat resistance, flame retardancy, low water absorption, and being halogen-free, and especially suitable for printed circuit board having high speed and high frequency signal transmission. Accordingly, this invention provides a copper clad laminate comprising two or more than two copper foils and at least one insulator. The copper foil further comprises alloy of at least one copper, aluminum, nickel, platinum, silver and gold. The insulator is formed by curing the prepreg at high temperature and high pressure. For example, the insulator is formed by stacking the prepreg above-mentioned between two foils and laminating at high temperature and high pressure.

The copper clad laminate described in this invention has at least one following advantages: low dielectric constant and low dissipation factor, excellent heat resistance and flame retardancy, low water absorption, higher thermal conductivity and halogen-free environment protection. The copper clad laminate forms a printed circuit board after proceeding the procedure such as layout manufacturing process. Thus, after bonding the electronic component onto the printed circuit board, the quality of the printed circuit board will not be influenced even if it is operating at severe condition such as high temperature or high humidity.

Yet another purpose of this invention is to disclose a printed circuit board having properties of low dielectric constant, heat resistance, flame retardant, low water absorption, and being halogen-free, and especially suitable for high speed and high frequency signal transmission. The printed circuit board comprises at least one copper clad laminate above-mentioned. And, the printed circuit board is manufactured by the conventional process.

To further disclose the present invention and allow persons skilled in the art to gain insight into the present invention, the present invention has been particularly described with respect to preferred embodiments thereof. It should be noted that the embodiment only used to describe the present invention and not intend to limit the scope of the invention. Any changes or replacement, made by persons skilled in the art without departing from the spirit of the present invention, will fall within the scope of the present invention.

DETAILED DESCRIPTION OF THE PREFERRED EMBODIMENTS

To fully understand purpose, feature and effect of this invention, the present invention has been particularly described as follow with respect to preferred embodiments.

Table 1 lists the resin compositions of embodiments 1 to 4 respectively. Table 3 lists the resin compositions of comparative examples 1 to 5.

Embodiment 1 (E1)

A resin composition comprises:
(A) 40 parts by weight of dicyclopentadiene epoxy resin (HP-7200);
(B) 60 parts by weight of biphenyl epoxy resin (NC-3000)
(C) 1.5 parts by weight of dicyandiamide (DICY);
(D) 50 parts by weight of benzoxazine resin (LZ 8280);
(E) 10 parts by weight of styrene-maleic anhydride (EF-60);
(F) 35 parts by weight of phosphazene compound (SPB-100);
(G) 35 parts by weight of fusedsilica;
(H) 0.3 parts by weight of catalyst (2E4MI);
(I) 45 parts by weight of methyl ethyl ketone (MEK);
(J) 20 parts by weight of dimethylacetamide (DMAC).

Embodiment 2 (E2)

A resin composition comprises:
(A) 40 parts by weight of dicyclopentadiene epoxy resin (HP-7200);
(B) 60 parts by weight of biphenyl epoxy resin (NC-3000);
(C) 8 parts by weight of diamino diphenyl sulfone (DDS);
(D) 15 parts by weight of benzoxazine resin (LZ 8280);
(E) 30 parts by weight of styrene-maleic anhydride (EF-30);
(F) 55 parts by weight of flame retardant (Dow XZ92741);
(G) 42 parts by weight of fused silica;
(H) 0.3 parts by weight of catalyst (2E4MI);
(I) 35 parts by weight of methyl ethyl ketone (MEK).

Example 3

E3

A resin composition comprises:
(A) 40 parts by weight of dicyclopentadiene epoxy resin (HP-7200);
(B) 60 parts by weight of biphenyl epoxy resin (NC-3000);
(C) 7 parts by weight of diaminodiphenyl ether (ODA);
(D) 27 parts by weight of benzoxazine resin (LZ 8280);
(E) 8 parts by weight of styrene-maleic anhydride (EF-60);
(F) 49 parts by weight of flame retardant (PX-200);
(G) 38 parts by weight of fused silica;
(H) 0.3 parts by weight of catalyst (2E4MI);
(I) 77 parts by weight of methyl ethyl ketone (MEK).

Embodiment 4 (E4)

A resin composition comprises:
(A) 40 parts by weight of dicyclopentadiene epoxy resin (HP-7200);
(B) 60 parts by weight of biphenyl epoxy resin (NC-3000);
(C) 1 parts by weight of dicyandiamide (DICY);
(D) 3.5 parts by weight of diamino diphenyl sulfone (DDS);
(E) 1 parts by weight of diaminodiphenyl ether (ODA);
(F) 10 parts by weight of benzoxazine resin (LZ 8280);
(G) 20 parts by weight of styrene-maleic anhydride (EF-30);
(H) 15 parts by weight of styrene-maleic anhydride (EF-60);
(I) 22 parts by weight of flame retardant (PX-200);
(J) 30 parts by weight of flame retardant (Dow XZ92741);
(K) 30 parts by weight of fused silica;
(L) 10 parts by weight of spherical silica;
(M) 0.3 parts by weight of catalyst (2E4MI);
(N) 58 parts by weight of methyl ethyl ketone (MEK);
(O) 20 parts by weight of dimethyl acetamide (DMAC).

Comparative Example 1

C1

A resin composition comprises:
(A) 40 parts by weight of dicyclopentadiene epoxy resin (HP-7200);
(B) 60 parts by weight of biphenyl epoxy resin (NC-3000);
(C) 3.3 parts by weight of dicyandiamide (DICY);
(D) 36 parts by weight of phosphazene compound (SPB-100);
(E) 28 parts by weight of fused silica;
(F) 0.3 parts by weight of catalyst (2E4MI);
(G) 42 parts by weight of methyl ethyl ketone (MEK);
(H) 20 parts by weight of dimethyl acetamide (DMAC).

Comparative Example 2

C2

A resin composition comprises:
(A) 40 parts by weight of dicyclopentadiene epoxy resin (HP-7200);
(B) 60 parts by weight of biphenyl epoxy resin (NC-3000);
(C) 70 parts by weight of benzoxazine resin (LZ 8280);
(D) 40 parts by weight of styrene-maleic anhydride (EF-30);
(E) 72 parts by weight of flame retardant (DOW XZ92741);
(F) 57 parts by weight of fused silica;
(G) 0.3 parts by weight of catalyst (2E4MI);
(H) 80 parts by weight of methyl ethyl ketone (MEK);

Comparative example 3

C3

A resin composition comprises:
(A) 40 parts by weight of dicyclopentadiene epoxy resin (HP-7200);
(B) 60 parts by weight of biphenyl epoxy resin (NC-3000);
(C) 7.2 parts by weight of diaminodiphenyl ether (ODA);
(D) 70 parts by weight of styrene-maleic anhydride (EF-60);
(E) 60 parts by weight of flame retardant (PX-200);
(F) 47 parts by weight of fused silica;
(G) 0.3 parts by weight of catalyst (2E4MI);
(H) 114 parts by weight of methyl ethyl ketone (MEK).

Comparative Example 4

C4

A resin composition comprises:
(A) 40 parts by weight of dicyclopentadiene epoxy resin (HP-7200);
(B) 60 parts by weight of biphenyl epoxy resin (NC-3000);
(C) 8.5 parts by weight of diamino diphenyl sulfone (DDS);
(D) 50 parts by weight of benzoxazine resin (LZ 8280);
(E) 30 parts by weight of bromine-containing flame retardant (SAYTEX 8010(10Br));
(F) 41 parts by weight of fused silica;
(G) 0.3 parts by weight of catalyst (2E4MI);
(H) 97 parts by weight of methyl ethyl ketone (MEK).

Comparative Example 5

C5

A resin composition comprises:
(A) 40 parts by weight of dicyclopentadiene epoxy resin (HP-7200);
(B) 60 parts by weight of biphenyl epoxy resin (NC-3000);
(C) 8 parts by weight of diamino diphenyl sulfone (DDS);
(D) 15 parts by weight of benzoxazine resin (LZ 8280);
(E) 30 parts by weight of styrene-maleic anhydride (EF-30);
(F) 30 parts by weight of fused silica;
(G) 0.3 parts by weight of catalyst (2E4MI);
(H) 56 parts by weight of methyl ethyl ketone (MEK).

The resin composition of embodiments 1 to 4 and comparative examples 1 to 5 above-mentioned were fully mixed in batches in the stirred tank and then placed in the immersing tank. Then, the glass fabric was passed through the immersing tank above-mentioned so that the resin composition cohered to the glass fabric. After that, the glass fabric was heated to be a semi-cured state and a prepreg was formed.

Among the prepreg prepared in batches above-mentioned, four pieces of prepreg made by the same batch and two 18 μm copper foils were stacked in sequence of copper foil, four pieces of prepreg and copper foil. And then, the copper clad laminate was formed after pressing at 220° C. for 2 hours in vacuum condition. These four pieces of prepreg were solidified and became an insulator between two copper foils.

The physical properties of the above laminate with copper foil and the etched laminate without copper foil were measured respectively. The item of the measured physical properties includes the glass transition temperature (Tg), heat resistance of the laminate with copper foil (T288), solder dipping test of the laminate with copper foil (solder dip 288° C. for 10 seconds to test the number of times of the heat resistance, S/D), solder dipping of the laminate without copper foil after PCT moisture absorbing (pressure cooking at 121° C., after 1 hour, solder dipping test at 288° C. for 20 seconds, observing if blister or popcorn occurred, PCT), the strength between the copper foil and the laminate (peeling strength, half ounce copper foil, P/S), dielectric constant (the lower Dk is better), dissipation factor (the lower Df is better), flame retardancy (flaming test, UL 94, wherein the order from excellent to worse is V-0>V-1>V-2).

Table 2 lists the measured physical properties result of the laminates formed by the resin composition of embodiments 1 to 4. Table 4 lists the measured physical properties result of the laminates formed by the resin composition of comparative examples 1 to 5. As shown in Table 2 and Table 4, after comparing the embodiments 1 to 4 and the comparative examples 1 to 5, it can be found that the physical properties of the laminate formed according to the ratio of the resin composition of this invention is better than the laminate formed by the comparative examples 1 to 5. Three different kinds of amine curing agent are used respectively in embodiments 1 to 3. It is shown that the better heat resistance (Tg, T288, (S/D)) and the copper strength (P/S) of the laminates are obtained by using the diamino diphenyl sulfone with benzoxazine resin and styrene-maleic anhydride. The better dielectric constant (Dk) and dissipation factor (Df) of the laminates are obtained by using the dicyandiamide with benzoxazine resin and styrene-maleic anhydride.

As indicated in the result of the comparative example 1, the laminate, which has amine curing agent (DICY) and no benzoxazine resin and styrene-maleic anhydride, has worse heat resistance (Tg, T288, S/D, PCT). According to the comparative example 2, the laminate, which has benzoxazine resin and styrene-maleic anhydride and no amine curing agent (DICY), has worse heat resistance (T288, S/D), copper foil strength (P/S) and dielectric constant (Dk). According to the comparative example 3, the laminate, which has amine curing agent and styrene-maleic anhydride but no benzoxazine resin, has worse heat resistance (Tg, T288, S/D, PCT), copper foil strength (P/S), dielectric constant (Dk) and dissipation factor (Df). According to the comparative example 4, the laminate, which has amine curing agent and benzoxazine resin but has no styrene-maleic anhydride, has worse electric properties. Moreover, since the bromine-containing compound is used in the comparative example 4 as the flame retardant, the flame resistance degree of UL94 V-0 is achieved. However, the halogen-free resin composition disclosed in this invention is more environmental protective since no halogen (bromine) is used. According to the comparative example 5, the laminate, which has amine curing agent, benzoxazine resin and styrene-maleic anhydride but no flame retardant, has worse flame retardant degree UL94V-2 and cannot achieve the better V-0 degree.

TABLE 1

| Composition | | E1 | E2 | E3 | E4 |
|---|---|---|---|---|---|
| Epoxy resin | HP-7200 | 40 | 40 | 40 | 40 |
| | NC-3000 | 60 | 60 | 60 | 60 |
| Amine curing agent | DICY | 1.5 | — | — | 1 |
| | DDS | — | 8 | — | 3.5 |
| | ODA | — | — | 7 | 1 |
| Benzoxazine resin | LZ 8280 | 50 | 15 | 27 | 10 |
| Styrene-maleic anhydride | EF-30 | — | 30 | — | 20 |
| | EF-60 | 10 | — | 8 | 15 |
| Flame retardant | SPB-100 | 35 | — | — | — |
| | PX-200 | — | — | 49 | 22 |
| | DOW XZ92741 | — | 55 | — | 30 |
| Inorganic filler | Fused silica | 35 | 42 | 38 | 30 |
| | Spherical silica | — | — | — | 10 |
| Catalyst | 2E4MI | 0.3 | 0.3 | 0.3 | 0.3 |
| solvent | MEK | 45 | 35 | 77 | 58 |
| | DMAC | 20 | — | — | 20 |

TABLE 2

| Properties test | Testing method | E1 | E2 | E3 | E4 |
|---|---|---|---|---|---|
| Tg | DSC | 167 | 172 | 158 | 171 |
| T288 (clad) | TMA (min) | 19 | >70 | >70 | >70 |
| S/D | dip cycles | 18 | >20 | >20 | >20 |
| PCT (1 hr) | dip 288° C., 20 s | pass | pass | pass | pass |
| P/S | Hoz Cu foil | 6.1 | 6.8 | 6.5 | 7.1 |
| Dk | 1 GHz | 3.91 | 4.05 | 3.98 | 3.90 |
| Df | 1 GHz | 0.009 | 0.011 | 0.010 | 0.009 |
| Flaming test | UL94 | V-0 | V-0 | V-0 | V-0 |
| other | PP appearance | Smooth | Smooth | Smooth | Smooth |

TABLE 3

| composition | | C1 | C2 | C3 | C4 | C5 |
|---|---|---|---|---|---|---|
| Epoxy resin | HP-7200 | 40 | 40 | 40 | 40 | 40 |
| | NC-3000 | 60 | 60 | 60 | 60 | 60 |
| Amine curing agent | DICY | 3.3 | — | — | — | — |
| | DDS | — | — | — | 8.5 | 8 |
| | ODA | — | — | 7.2 | — | — |
| Benzoxazine resin | LZ 8280 | — | 70 | — | 50 | 15 |
| Styrene-maleic anhydride | EF-30 | — | 40 | — | — | 30 |
| | EF-60 | — | — | 70 | — | — |
| Flame retardant | SPB-100 | 36 | — | — | — | — |
| | PX-200 | — | — | 60 | — | — |
| | DOW XZ92741 | — | 72 | — | — | — |
| | SAYTEX 8010 | — | — | — | 30 | — |
| Inorganic filler | Fused silica | 28 | 57 | 47 | 41 | 30 |
| Catalyst | 2E4MI | 0.3 | 0.3 | 0.3 | 0.3 | 0.3 |
| solvent | MEK | 42 | 80 | 114 | 97 | 56 |
| | DMAC | 20 | — | — | — | — |

TABLE 4

| Properties test | Testing method | C1 | C2 | C3 | C4 | C5 |
|---|---|---|---|---|---|---|
| Tg | DSC | 161 | 168 | 147 | 171 | 174 |
| T288 (clad) | TMA (min) | 5 | 22 | 32 | >70 | >70 |
| S/D | dip cycles | 3 | 18 | 8 | >20 | >20 |
| PCT (1 hr) | dip 288° C., 20 s | fail | pass | fail | pass | pass |
| P/S | Hoz Cu foil | 6.7 | 5.2 | 5.8 | 6.3 | 6.9 |
| Dk | 1 GHz | 3.93 | 4.14 | 4.25 | 4.21 | 4.04 |
| Df | 1 GHz | 0.015 | 0.009 | 0.012 | 0.013 | 0.011 |
| Flaming test | UL94 | V-0 | V-0 | V-0 | V-0 | V-2 |
| Other | PP appearance | Smooth | Rough | Rough | Smooth | Smooth |

As above-mentioned, this invention meets three requirements of patentability: novelty, non-obviousness and industrial applicability. As for the novelty and non-obviousness, the halogen-free resin composition disclosed in this invention obtains the properties of low dielectric constant, low dissipation factor, high heat resistance and high flame resistant by the specific composition and the ratio. Moreover, the prepreg and the resin film prepared by this invention can be further applied to the copper clad laminate or printed circuit board. As for the industrial applicability, the derivation products of this invention satisfy the requirement of the market.

While the present invention has been particularly shown and described with respect to preferred embodiments thereof, it will be understood by persons skilled in the art that the embodiment only used to describe the present invention and not to limit the scope of the invention. It should be noted that any changes or replacement will fall within the scope of the present invention. Thus, the scope of present invention should be determined by appended Claims.

What is claimed is:

1. A halogen-free resin composition, comprising:
   (A) 100 parts by weight of epoxy resin;
   (B) 1 to 100 parts by weight of benzoxazine resin per 100 parts by weight of (A);
   (C) 1 to 100 parts by weight of styrene-maleic anhydride per 100 parts by weight of (A);
   (D) 0.5 to 30 parts by weight of amine curing agent per 100 parts by weight of (A); and
   (E) 5 to 150 parts by weight of halogen-free flame retardant per 100 parts by weight of (A);
   wherein the amine curing agent is diamino diphenyl ether.

2. The composition according to claim 1, wherein the epoxy resin is selected from the group consisting of at least one of: bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, phosphorous-containing epoxy resin, DOPO-containing epoxy resin, DOPO-HQ-containing epoxy resin, p-xylene epoxy resin, naphthalene epoxy resin, benzopyran epoxy resin, biphenyl novolac epoxy resin, isocyanate modified epoxy resin, phenol benzaldehyde epoxy resin and phenol aralkyl novolac epoxy resin.

3. The composition according to claim 1, wherein the benzoxazine resin is selected from the group consisting of at least one of: bisphenol A type benzoxazine resin, bisphenol B type benzoxazine resin and phenolphthalein type benzoxazine resin.

4. The composition according to claim 1, wherein the halogen-free flame retardant is selected from the group consisting of at least one of: bisphenol diphenyl phosphate, ammonium poly phosphate, hydroquinone bis-(diphenyl phosphate), bisphenol A bis-(diphenylphosphate), tri(2-carboxyethyl)

phosphine (TCEP), tri(isopropyl chloride) phosphate, trimethyl phosphate (TMP), dimethyl methyl phosphonate (DMMP), resorcinol dixylenyl phosphate (RDXP), phosphazene, melamine polyphosphate, melamine cyanurate, trihydroxy ethyl isocyanurate, 9,10-dihydro-9-oxa-10-phosphaphenanthrene-10-oxide (DOPO), DOPO-containing phenol resin, DOPO-containing epoxy resin, and DOPO-HQ-containing epoxy resin.

5. The composition according to claim 1, further comprising at least one selected from the group consisting of: inorganic filler, curing accelerator, silane coupling agent, toughening agent and solvent.

6. The composition according to claim 5, wherein the inorganic filler is selected from the group consisting of at least one of: silica (fused, non-fused, porous, hollow), aluminium oxide, aluminium hydroxide, magnesium oxide, magnesium hydroxide, calcium carbonate, aluminium nitride, boron nitride, aluminium silicon carbide, silicon carbide, titanium dioxide, zinc oxide, zirconium oxide, mica, Boehmite, calcined talcum powder, talcum powder, silicon nitride and calcined kaolinite.

7. The composition according to claim 1, further comprising at least one selected from the group consisting of: phenol resin, phenol novolac resin, polyphenylene ether resin, cyanate ester resin, isocyanate ester resin, maleimide resin, polyester resin, styrene resin, butadiene resin, phenoxy resin, polyamide resin, and polyimide resin.

8. A prepreg comprising the composition according to claim 1.

9. A copper clad laminate comprising the prepreg according to claim 8.

10. A printed circuit board comprising the copper clad laminate according to claim 9.

* * * * *